(12) United States Patent
Endres et al.

(10) Patent No.: US 10,133,182 B2
(45) Date of Patent: Nov. 20, 2018

(54) ILLUMINATION OPTICAL ASSEMBLY FOR A PROJECTION EXPOSURE APPARATUS

(71) Applicant: Carl Zeiss SMT GmbH, Oberkochen (DE)

(72) Inventors: Martin Endres, Koenigsbronn (DE); Stig Bieling, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/436,452

(22) Filed: Feb. 17, 2017

(65) Prior Publication Data

US 2017/0160643 A1 Jun. 8, 2017

Related U.S. Application Data

(63) Continuation of application No. PCT/EP2015/069371, filed on Aug. 24, 2015.

(30) Foreign Application Priority Data

Sep. 3, 2014 (DE) .................. 10 2014 217 620

(51) Int. Cl.
*G03B 27/54* (2006.01)
*G03B 27/72* (2006.01)
(Continued)

(52) U.S. Cl.
CPC ....... *G03F 7/70075* (2013.01); *G02B 5/0891* (2013.01); *G02B 5/09* (2013.01);
(Continued)

(58) Field of Classification Search
CPC .... G02B 5/0891; G02B 5/09; G02B 26/0833; G02B 26/101; G03F 7/70033; G03F 7/70075; G03F 7/70116
(Continued)

(56) References Cited

U.S. PATENT DOCUMENTS

2006/0132747 A1 6/2006 Singer et al.
2012/0154777 A1 6/2012 De Vries et al.
(Continued)

FOREIGN PATENT DOCUMENTS

DE 10 2010 029 765 A1 12/2011
DE 10 2011 006 100 A1 9/2012
(Continued)

OTHER PUBLICATIONS

International Search Report and Written Opinion for corresponding PCT Appl No. PCT/EP2015/069371, dated Apr. 22, 2016.
(Continued)

*Primary Examiner* — Colin Kreutzer

(74) *Attorney, Agent, or Firm* — Fish & Richardson P.C.

(57) ABSTRACT

An illumination optical assembly for a projection exposure apparatus includes a first facet element having a multiplicity of first facets, which are formed in each case by a multiplicity of displaceable individual mirrors, and a second facet element having a multiplicity of second facets. The displacement positions of the individual mirrors of the first facets are chosen in each case in so that, in the case of a predefined intensity distribution of an illumination radiation in an intermediate focus, the illumination radiation in the region of the facets of the second facet element has an intensity distribution with a maximum which is at most equal to a predefined maximum intensity or which is greater than a mean value of the intensity distribution by at most a predefined factor or absolute value.

18 Claims, 11 Drawing Sheets

(51) Int. Cl.
*G03F 7/20* (2006.01)
*G02B 26/08* (2006.01)
*G02B 26/10* (2006.01)
*G02B 5/08* (2006.01)
*G02B 5/09* (2006.01)

(52) U.S. Cl.
CPC ....... *G02B 26/0833* (2013.01); *G02B 26/101* (2013.01); *G03F 7/70116* (2013.01)

(58) Field of Classification Search
USPC ..................................... 355/67, 71; 359/904
See application file for complete search history.

(56) References Cited

U.S. PATENT DOCUMENTS

| | | |
|---|---|---|
| 2013/0194559 A1 | 8/2013 | Patra |
| 2014/0055767 A1 | 2/2014 | Waldis et al. |
| 2014/0362361 A1 | 12/2014 | Patra |
| 2015/0092174 A1 | 4/2015 | Endres et al. |
| 2016/0154316 A1 | 6/2016 | Patra |

FOREIGN PATENT DOCUMENTS

| | | |
|---|---|---|
| DE | 10 2012 201 235 A1 | 8/2013 |
| DE | 10 2012 204 273 A1 | 9/2013 |
| DE | 10 2012 212 453 A1 | 1/2014 |
| WO | WO 2010/037437 A1 | 4/2010 |
| WO | WO 2010 099807 A1 | 9/2010 |
| WO | WO 2011/154244 A1 | 12/2011 |

OTHER PUBLICATIONS

German Office Action, with translation thereof, for corresponding DE Appl No. 10 2014 217 620.4, dated Feb. 27, 2015.

| 1 | 3 | 6 | 9 | 9 | 6 | 3 | 1 |
|---|---|---|---|---|---|---|---|
| 3 | 9 | 20 | 30 | 30 | 20 | 9 | 3 |
| 6 | 20 | 45 | 67 | 67 | 45 | 20 | 6 |
| 9 | 30 | 67 | 100 | 100 | 67 | 30 | 9 |
| 9 | 30 | 67 | 100 | 100 | 67 | 30 | 9 |
| 6 | 20 | 45 | 67 | 67 | 45 | 20 | 6 |
| 3 | 9 | 20 | 30 | 30 | 20 | 9 | 3 |
| 1 | 3 | 6 | 9 | 9 | 6 | 3 | 1 |

| 3 | 7 | 12 | 15 | 15 | 12 | 7 | 3 |
|---|---|---|---|---|---|---|---|
| 7 | 16 | 25 | 31 | 31 | 25 | 16 | 7 |
| 12 | 25 | 40 | 51 | 51 | 40 | 25 | 12 |
| 15 | 31 | 51 | 63 | 63 | 51 | 31 | 15 |
| 15 | 31 | 51 | 63 | 63 | 51 | 31 | 15 |
| 12 | 25 | 40 | 51 | 51 | 40 | 25 | 12 |
| 7 | 16 | 25 | 31 | 31 | 25 | 16 | 7 |
| 3 | 7 | 12 | 15 | 15 | 12 | 7 | 3 |

Fig. 8

ILLUMINATION OPTICAL ASSEMBLY FOR A PROJECTION EXPOSURE APPARATUS

CROSS-REFERENCE TO RELATED APPLICATIONS

The present application is a continuation of, and claims benefit under 35 USC 120 to, international application PCT/EP2015/069371, filed Aug. 24, 2015, which claims benefit under 35 USC 119 of German Application No. 10 2014 217 620.4, filed Sep. 3, 2014. The entire disclosure of international application PCT/EP2015/069371 and German Application No. 10 2014 217 620.4 are incorporated by reference herein.

FIELD

The disclosure relates to an illumination optical assembly for a projection exposure apparatus. The disclosure also relates to a method for setting such an illumination optical assembly. Furthermore, the disclosure relates to a facet mirror for an illumination optical assembly of a projection exposure apparatus. In addition, the disclosure relates to an illumination system including such an illumination optical assembly, an optical system including such an illumination optical assembly, and a projection exposure apparatus including such an optical system. Finally, the disclosure relates to a method for producing a micro- or nanostructured component, and a component produced according to this method.

BACKGROUND

An illumination optical assembly for a projection exposure apparatus is known from WO 2010/099807 A1.

SUMMARY

It has been recognized that the mirrors of such an illumination optical assembly are subjected to a great thermal load during the operation of the projection exposure apparatus.

In an aspect, the disclosure seeks to improve an illumination optical assembly for a projection exposure apparatus, in particular with regard to the thermal load to which the individual constituents of the illumination optical assembly are subjected during the operation of the projection exposure apparatus.

The disclosure provides an illumination optical assembly for a projection exposure apparatus. The assembly includes a first facet element having a multiplicity of first facets which are displaceable into different displacement positions. The assembly also includes a second facet element having a multiplicity of second facets. Illumination channels for illuminating an object field with illumination radiation are defined by an assignment of a respective one of the first facets to a respective one of the second facets. The first facets are formed in each case by a multiplicity of displaceable individual mirrors. Each of the individual mirrors of the first facets is displaceable in such a way that it generates in each case an image of the intermediate focus on the respectively assigned second facet. The displacement positions of the individual mirrors of the first facets are chosen in such a way that, in the case of a predefined intensity distribution of the illumination radiation in the intermediate focus, the illumination radiation in the region of the facets of the second facet element has an intensity distribution with a maximum which is at most equal to a predefined maximum intensity or which is greater than a mean value of the intensity distribution by at most a predefined factor or absolute value The disclosure includes choosing the displacement positions of the individual mirrors which form the first facets in such a way that the intensity distribution of the illumination radiation in the region of the second facet element does not exceed a predefined maximum value. In this case, the maximum value can be predefined in absolute terms as maximum permissible intensity $I_{max}$. It can also be predefined relative to a mean value of the intensity distribution. The mean value of the intensity distribution can be given in this case in particular as an integral of the intensity distribution over the area of the respective second facet divided by the surface area of these facets.

The maximum of the intensity distribution in the region of this facet can be greater than the mean value for example at most by a factor of 32, in particular by a factor of 16, in particular at most 8, in particular at most 4, in particular at most 2, in particular at most 1.5.

The maximum of the intensity distribution can also be greater than the mean value of the intensity distribution by at most 100 kW/m$^2$, in particular at most 50 kW/m$^2$, in particular at most 30 kW/m$^2$, in particular at most 20 kW/m$^2$, in particular at most 10 kW/m$^2$.

The predefined maximum intensity $I_{max}$ can be in particular at most 500 kW/m$^2$, in particular at most 300 kW/m$^2$, in particular at most 200 kW/m$^2$, in particular at most 100 kW/m$^2$, in particular at most 50 kW/m$^2$, in particular at most 30 kW/m$^2$, in particular at most 20 kW/m$^2$, in particular at most 10 kW/m$^2$, in particular at most 5 kW/m$^2$, in particular at most 2 kW/m$^2$.

According to the disclosure, it has been recognized that the construction of the first facet element with a multiplicity of individual mirrors which are individually displaceable makes it possible to shift relative to one another the images of the intermediate focus which each of the individual mirrors generates on the respectively assigned second facet. The intensity distribution in the region of the second facet element can be influenced as a result. It is possible, in particular, to influence the intensity distribution in the region of the second facet element, in particular in the region of each of the second facets, by a displacement of a subset of the individual mirrors in such a way that its maximum fulfils at least one of the abovementioned criteria.

The number of images of the intermediate focus on a given one of the second facets can in particular be equal to the number of individual mirrors which form the associated first facet. This number can be in the range of 1 to 10,000, in particular in the range of 1 to 3000, in particular in the range of 1 to 1000.

The indications concerning the intensity and the intensity distribution are time-averaged values, in particular. In principle, it is also possible for the indicated values to indicate the temporal peak values of the intensity.

The individual mirrors are micro mirrors, in particular. The individual mirrors of the first facet element have in particular side lengths of less than 1 cm, in particular less than 5 mm, in particular less than 2 mm, in particular less than 1 mm, in particular less than 700 µm, in particular less than 500 µm.

In accordance with a further aspect of the disclosure, the second facet element includes a mirror array having a plurality of modular multi-mirror elements, wherein the multi-mirror elements in each case have dimensions which are at least equal to the dimensions of the images of the intermediate focus in the region of the second facet element. The modular multi-mirror elements are also designated as building blocks or bricks. The bricks in each case have dimensions which are at least equal to those of the source image, in particular the image of the intermediate focus in the region of the second facet element.

The second facets are formed in particular by a multiplicity of individual mirrors, in particular a multiplicity of micro mirrors. The modular multi-mirror elements are embodied in particular as a multi-mirror array (MMA), in particular as a microelectromechanical system (MEMS), in particular as an MEMS-MMA. For details of such MEMS-MMAs, reference should be made to DE 10 2011 006 100 A1, for example. An embodiment of the second facet element, in particular of the second facets, with such an MEMS-MMA considerably extends the flexibility of the illumination optical assembly, in particular when forming illumination channels for illuminating the illumination field and for setting a predefined illumination setting.

The second facets are virtual facets, in particular. Pupil facets can be involved, in particular. Facets of a specular reflector can generally also be involved.

The second facets can in particular be varied flexibly in terms of size and/or shape and/or arrangement, in particular adapted to predefined boundary conditions.

In accordance with one aspect of the disclosure, the displacement positions of a plurality of the individual mirrors of a given first facet are chosen in such a way that they generate images of the intermediate focus on the respectively assigned second facet whose maxima are offset relative to one another by a minimum absolute value. For a given first facet, in particular, there are at least two individual mirrors whose displacement positions are chosen in such a way that they generate images of the intermediate focus on the respectively assigned second facet whose maxima are offset relative to one another by a minimum absolute value.

The maximum of the intensity distribution on the corresponding second facet can be reduced as a result. The minimum absolute value of the offset of the images of the intermediate focus is in particular at least equal to the width of one of the individual mirrors which form the second facets. It can also be double the magnitude of the width. The offset, in particular the minimum absolute value thereof, can also be defined depending on the full width at half maximum of the intensity distribution of the image of the intermediate focus on the respective second facet. The minimum absolute value can be in particular equal to half the full width at half maximum, equal to the full width at half maximum, equal to double the full width at half maximum or equal to triple the full width at half maximum.

The displacement positions of the individual mirrors are chosen in particular in such a way that at most 20%, in particular at most 10%, in particular at most 5%, in particular at most 1%, of the energy of a plasma image lies beyond the respectively assigned second facet, that is to say cannot be reflected by the second facet.

The maximum possible shift defines a region within which the shifts are distributed preferably as uniformly as possible. The displacement positions are chosen in particular in such a way that the intensity distribution on the second facet is as homogeneous as possible.

The abovementioned minimum absolute value of the offset of the images of the intermediate focus on the second facet can form a lower limit for the maximum distance between second intermediate focus images on the same virtual second facet.

An offset of the images of the intermediate focus relative to one another makes it possible to widen the intensity distribution on the second facets in a targeted manner. It is possible, in particular, to shift an intensity from a central region of a second facet into an edge region. It is possible, in particular, to make the illumination of the second facets more homogeneous.

In accordance with a further aspect of the disclosure, the individual mirrors of at least one of the first facets are displaced in such a way that in the case of a given intensity distribution in the intermediate focus the intensity distribution of the image of the intermediate focus on the corresponding second facet has a full width at half maximum which is at least 10%, in particular at least 20%, in particular at least 30%, in particular at least 50%, in particular at least 70%, in particular at least 100%, in particular at least 150%, in particular at least 200%, in particular at least 300%, greater than the full width at half maximum—scaled by an imaging scale of the illumination optical assembly—of the intensity distribution in the intermediate focus.

A widening of the intensity distribution of the image of the intermediate focus on the second facets makes it possible to reduce the maximum value of the intensity on the second facets. According to the disclosure, it has been recognized that the fact that in general the shape of the intensity distribution on the second facets is also altered here is of secondary importance in the present context.

In accordance with a further aspect of the disclosure, at least two of the second facets have different dimensions.

It is possible, in particular, for those second facets which serve for illuminating particularly large partial fields to be made larger than those second facets which illuminate smaller partial fields. The size of the virtual second facets can be chosen in particular depending on the size of the partial fields to be illuminated. A larger size of the second facets enables a larger shift of the images of the intermediate focus. The radiation power can thus be distributed over a larger region, that is to say that the intensity, in particular the maximum intensity of the illumination radiation on the second facets, can be reduced.

Preferably, the facets which illuminate partial fields which are arranged at a common height with respect to the scan direction, that is to say which have the same y-coordinate with the coordinate system that will be introduced below, have an identical shape. Field dependencies in the pupil can be avoided as a result.

On the other hand, the facets, depending on the y-coordinate, can have different grid constants in the x-direction of the pupil. It can be provided, in particular, that at least two facets which have different y-coordinates have different dimensions in the x-direction.

This leads to a very characteristic pupil. The latter has a variable distance of the illumination channels in the x-direction depending on the pupil coordinates in the y-direction. This property of the pupil is very predominant and has to be taken into account in the design of the mask.

In an aspect, the disclosure seeks to improve a method for setting an illumination optical assembly.

The disclosure provides a method including the following steps:
  providing an illumination optical assembly according to the description above,
  predefining an intensity distribution in the intermediate focus,
  predefining an assignment of at least one subset of the first facets to at least one subset of the second facets for forming illumination channels, predefining a maximum intensity ($I_{max}$), which is permitted to impinge on the second facets, determining a distribution of the intensity ($I(\sigma)$) which impinges on the second facets in the case of the given assignment, displacing a subset of the individual mirrors of the first facets such that the intensity ($I(\sigma)$) on the second facets is at most equal to $I_{max}$.

The disclosure includes displacing a subset of the individual mirrors of the first facets in such a way that the intensity distribution on the second facets fulfils specific boundary conditions. A displacement of the individual mirrors of the first facets makes it possible to ensure, in particular, that the maximum intensity on the second facets is at most equal to a predefined maximum value $I_{max}$. A displacement of a subset of the individual mirrors of the first facets is provided, in particular, if the intensity distribution $I(\sigma)$ on at least one of the second facets has a maximum which is greater than the predefined permissible maximum value $I_{max}$, $\max(I(\sigma)) > I_{max}$.

As has already been described above, it is possible to widen the intensity distribution on the second facets by a displacement of a subset of the individual mirrors. It is possible, in particular, to make the intensity distribution over the second facets more homogeneous.

In accordance with a further aspect of the disclosure, a minimum transmittance $T_{min}$ is predefined which is attained by the second facets after the displacement of the individual mirrors.

This is a boundary condition which has to be taken into account in the displacement of the individual mirrors of the first facets. In this regard, it has been recognised that an excessively large displacement of the individual mirrors has the effect that the illumination radiation reflected by the latter is no longer incident on the corresponding associated second facets and is therefore lost for illuminating the illumination field. Illustratively, this is expressed for simplification to the effect that the illumination radiation falls off the second facets. This is intended advantageously to be avoided.

The term transmittance should be understood geometrically in this context. It should be understood, in particular, to the effect that it specifies the ratio of the power of the illumination radiation actually reflected by one of the second facets after the displacement of the individual mirrors of the first facets with respect to the theoretically possible reflected power of the illumination radiation in the case where all images of the intermediate focus are centred on the second facet and the second facet has a simply connected, in particular an uninterrupted, reflection surface.

With this definition, the transmittance serves in particular for characterizing the proportion of the illumination radiation which falls off the second facets as a result of the displacement of the individual mirrors of the first facets.

What can be achieved with the boundary condition of a predefined minimum transmittance is that the maximum intensity on the second facets is reduced, while the mean value of the intensity on the second facets and in particular the area integral of the intensity distribution over the second facets, that is to say the power respectively reflected by the second facets, decrease at most as far as a predefined value, in particular remain substantially constant.

In accordance with a further aspect of the disclosure, the size of the second facets is chosen depending on a power to be reflected and/or an expected thermal load and/or a predefined minimum transmission value.

It is possible, in particular, for the size of the second facets, which are formed in particular by a multiplicity of individual mirrors, that is to say which are embodied as virtual second facets, to be chosen flexibly as desired. In this regard, it is possible for all of the second facets to have an identical shape and/or an identical size. However, it is also possible for at least two of the second facets to have a different shape and/or a different size. The size of the second facets can in particular also be chosen depending on the partial field to be illuminated. Generally, the second facets which serve for illuminating larger partial fields can be made larger than those second facets which serve for illuminating smaller partial fields.

In one aspect, the disclosure seeks to improve a facet mirror for an illumination optical assembly.

The disclosure provides a facet mirror including a multi-mirror array having a multiplicity of displaceable individual mirrors, wherein the number and arrangement of the individual mirrors of the multi-mirror array are chosen in such a way that the possibilities of a grouping thereof to form virtual facets have a reducible representation.

The multi-mirror array can be embodied in particular as a matrix, in particular as a square matrix. It has in particular n lines and m columns. The following can hold true here: n=m or n≠m. In this case, n and m are chosen in particular in such a way that they each have at least two different prime factors; n and m are chosen in particular in such a way that they have a particularly high number of devisors. This increases the flexibility in the uninterrupted division of the multi-mirror array, in particular in the division into identical partial fields. In the case of a mirror array having up to 100 lines and/or columns, the number of lines and/or columns is, in particular, 12, 18, 20, 24, 28, 30, 32, 36, 40, 42, 44, 45, 48 or 60. Particularly preferably, the values are 12, 24, 36, 48 or 60. These are in each case the smallest integers which have at least 6, 8, 9, 10 and 12 devisors, respectively.

The facet mirror is, in particular, a constituent of the second facet element. It can be, in particular, a constituent of a specular reflector. In the case where the latter is arranged in a pupil plane of the illumination optical assembly, the mirror is also designated as a pupil facet mirror.

Further aspects of the disclosure are to improve an illumination system for a projection exposure apparatus, an optical system for a projection exposure apparatus and a projection exposure apparatus. Aspects are respectively achieved via a corresponding system and a corresponding apparatus including an illumination optical assembly, according to the description above. The advantages are evident from those which have been described for the illumination optical assembly.

In the case of an illumination system including a given radiation source, it is possible to explicitly determine in particular the intensity distribution of the illumination radiation in the intermediate focus. The illumination optical assembly according to the description above, in particular the setting thereof, in particular the setting of the displacement of the individual mirrors of the first facet element, can be adapted to the specific details of the radiation source in this case.

Further aspects of the disclosure are to improve a method for producing a micro- or nanostructured component and a component produced in this way. Aspects are also achieved by virtue of the fact that an illumination optical assembly according to the description above is provided here. The advantages are again evident from those already described.

BRIEF DESCRIPTION OF THE DRAWINGS

Further advantages, details and particulars of the disclosure will become apparent from the description of exemplary embodiments with reference to the drawings, in which:

FIG. 7 shows an illustration of the normalized averaged power density for each of the individual mirrors of a second facet in the case of an intensity distribution in accordance with FIG. 5, FIG. 8 shows a corresponding illustration for an intensity distribution in accordance with FIG. 6.

DETAILED DESCRIPTION

Figure 1:
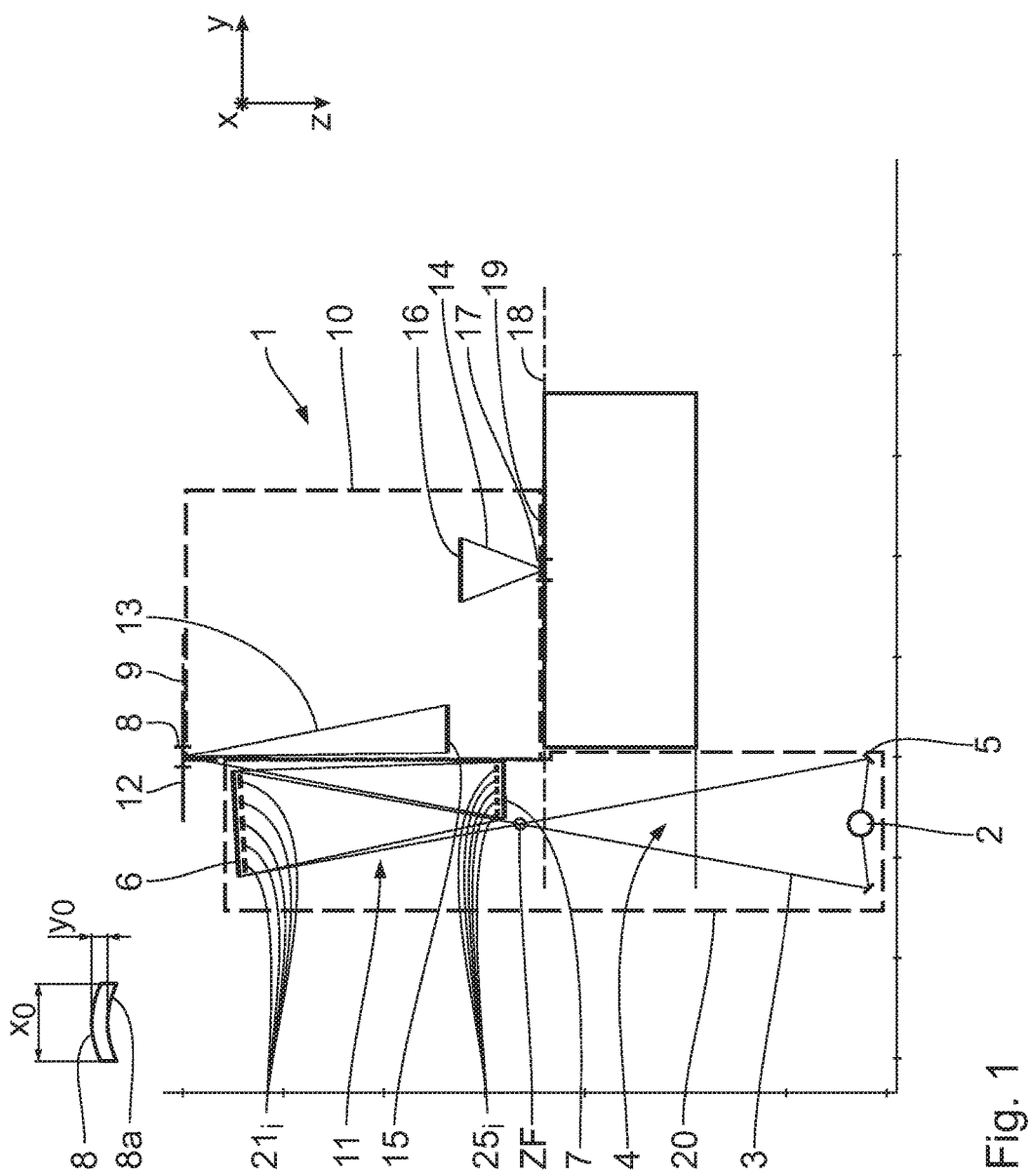
FIG. 1 shows highly schematically in meridional section a projection exposure apparatus for EUV microlithography including a radiation source, an illumination optical assembly and a projection optical assembly.

A projection exposure apparatus 1 for microlithography that is illustrated highly schematically and in meridional section in FIG. 1 has a radiation source 2 for illumination radiation 3. The radiation source is an EUV radiation source that generates light in a wavelength range of between 5 nm and 30 nm. This can be an LPP (Laser Produced Plasma) light source, a DPP (Discharge Produced Plasma) light source or a synchrotron-radiation-based light source, for example a free electron laser (FEL).

For guiding the illumination radiation 3, proceeding from the radiation source 2, use is made of a transfer optical assembly 4. The latter has a collector 5, which is illustrated only with regard to its reflective effect in FIG. 1, and a first facet mirror 6, which is also designated as transfer facet mirror or as field facet mirror or generally as first facet element. An intermediate focus ZF of the illumination radiation 3 is arranged between the collector 5 and the transfer facet mirror 6. A numerical aperture of the illumination radiation 3 in the region of the intermediate focus ZF is NA=0.182, for example. A second facet mirror 7, which is also designated as second facet element, is disposed downstream of the first facet mirror 6 and thus the transfer optical assembly 4. The optical components 5 to 7 are parts of an illumination optical assembly 11 of the projection exposure apparatus 1.

The illumination optical assembly 11 together with the radiation source 2 forms parts of an illumination system 20.

The first facet mirror 6 is arranged in a field plane of the illumination optical assembly 11.

In one embodiment of the illumination optical assembly 11, the second facet mirror 7 can be arranged in or in the region of a pupil plane of the illumination optical assembly 11 and is then also designated as pupil facet mirror. In a further embodiment, the second facet mirror 7 of the illumination optical assembly 11 can also be arranged at a distance from the pupil plane or the pupil planes of the illumination optical assembly 11. Such an embodiment is also designated as specular reflector. In principle, the arrangement of the second facet mirror 7 in a pupil plane is a special case of the specular reflector. For better conceptual delimitation, however, the term specular reflector hereinafter is designated exclusively for an arrangement of the second facet mirror 7 at a distance from the pupil plane or the pupil planes of the illumination optical assembly 11. The general case, which is not restricted to a specific arrangement within the illumination optical assembly 11, is designated as second facet mirror 7 for the sake of simplicity.

A reticle 12 is disposed downstream of the second facet mirror 7 in the beam path of the illumination radiation 3, the reticle being arranged in an object plane 9 of a downstream projection optical assembly 10 of the projection exposure apparatus 1. The projection optical assembly 10 and the projection optical assemblies of the further embodiments described below are in each case a projection lens. The illumination optical assembly 11 is used to illuminate an object field 8 on the reticle 12 in the object plane 9 in a defined manner. The object field 8 simultaneously constitutes an illumination field of the illumination optical assembly 11. Generally it holds true that the illumination field is formed in such a way that the object field 8 can be arranged in the illumination field.

The second facet mirror 7, like the first facet mirror 6 as well, is part of a pupil illumination unit of the illumination optical assembly and serves for illuminating an entrance pupil of the projection optical assembly 10 with the illumination radiation 3 with a predefined pupil intensity distribution. The entrance pupil of the projection optical assembly 10 can be arranged in the illumination beam path upstream of the object field 8 or else downstream of the object field 8.

In the case of the embodiment of the illumination optical assembly 11 including a pupil facet mirror 7 arranged in a pupil plane, the pupil plane can be imaged into the entrance pupil of the projection optical assembly 10 via a downstream transfer optical assembly. Alternatively, the illumination predefinition facet mirror 7 can also be arranged in the pupil plane of the entrance pupil of the projection optical assembly 10. In the case of the embodiment as a specular reflector, such a transfer optical assembly is not necessary and it is unimportant, in principle, whether the entrance pupil of the projection optical assembly 10 is arranged in the illumination beam path upstream of the object field 8 or downstream of the object field 8.

In order to facilitate the presentation of positional relationships, a Cartesian xyz-coordinate system is used hereinafter. The x-direction runs perpendicularly to the plane of the drawing into the latter in FIG. 1. The y-direction runs towards the right in FIG. 1. The z-direction runs downwards in FIG. 1. Coordinate systems used in the drawing have x-axes running parallel to one another in each case. The course of a z-axis of the coordinate systems follows a respective principal direction of the radiation 3 within the figure respectively under consideration. The y-direction is parallel to the scan direction in which the reticle 12 is scanned.

The object field 8 has an arcuate or partly circular shape and is delimited by two mutually parallel circle arcs and two straight side edges which run in the y-direction with a length $y_0$ and are at a distance $x_0$ from one another in the x-direction. The aspect ratio $x_0/y_0$ is 13 to 1. An insert in FIG. 1 shows a plan view of the object field 8, this plan view not being true to scale. A boundary shape 8a is arcuate. In an alternative and likewise possible object field 8, the boundary shape thereof is rectangular, likewise with aspect ratio $x_0/y_0$.

The projection optical assembly 10 is indicated only in part and highly schematically in FIG. 1. An object field side numerical aperture 13 and an image field side numerical aperture 14 of the projection optical assembly 10 are illustrated. Between indicated optical components 15, 16 of the projection optical assembly 10, which components can be embodied for example as mirrors that are reflective for the illumination radiation 3, there are situated further optical components—not illustrated in FIG. 1—of the projection optical assembly 10 for guiding the illumination radiation 3 between these optical components 15, 16.

The projection optical assembly 10 images the object field 8 into an image field 17 in an image plane 18 on a wafer 19, which, like the reticle 12 as well, is carried by a holder (not illustrated in more specific detail). Both the reticle holder and the wafer holder are displaceable both in the x-direction and in the y-direction via corresponding displacement drives.

The y-direction is, in particular, parallel to the scan direction.

The first facet mirror 6 has a multiplicity of first facets $21_i$. The first facets $21_i$ are displaceable into different displacement positions. They are also designated as switchable first facets $21_i$.

The first facets $21_i$ are formed in each case by a multiplicity of displaceable individual mirrors 31. The individual mirrors 31 are in particular micro mirrors, that is to say mirrors having an edge length in the micrometers range. However, the individual mirrors 31 can also have an edge length of up to a few millimeters.

The individual mirrors 31 are embodied in particular as a microelectromechanical system (MEMS). They are embodied as a multi-mirror array (MMA) 32.

The first facet mirror 6 can include in particular a multiplicity of modular MMAs 32.

The individual mirrors 31 are in each case displaceable. They have in particular at least two degrees of freedom, in particular at least two degrees of freedom of tilting. For details of the individual mirrors 31 and in particular the arrangement thereof in the multi-mirror array 32, reference should be made to DE 10 2011 006 100 A1.

The first facets 21 are formed by a multiplicity of the individual mirrors 31. Virtual first facets are involved, in particular. The grouping of the individual mirrors 31 to form individual first facets 21 is flexibly variable.

Figure 2:
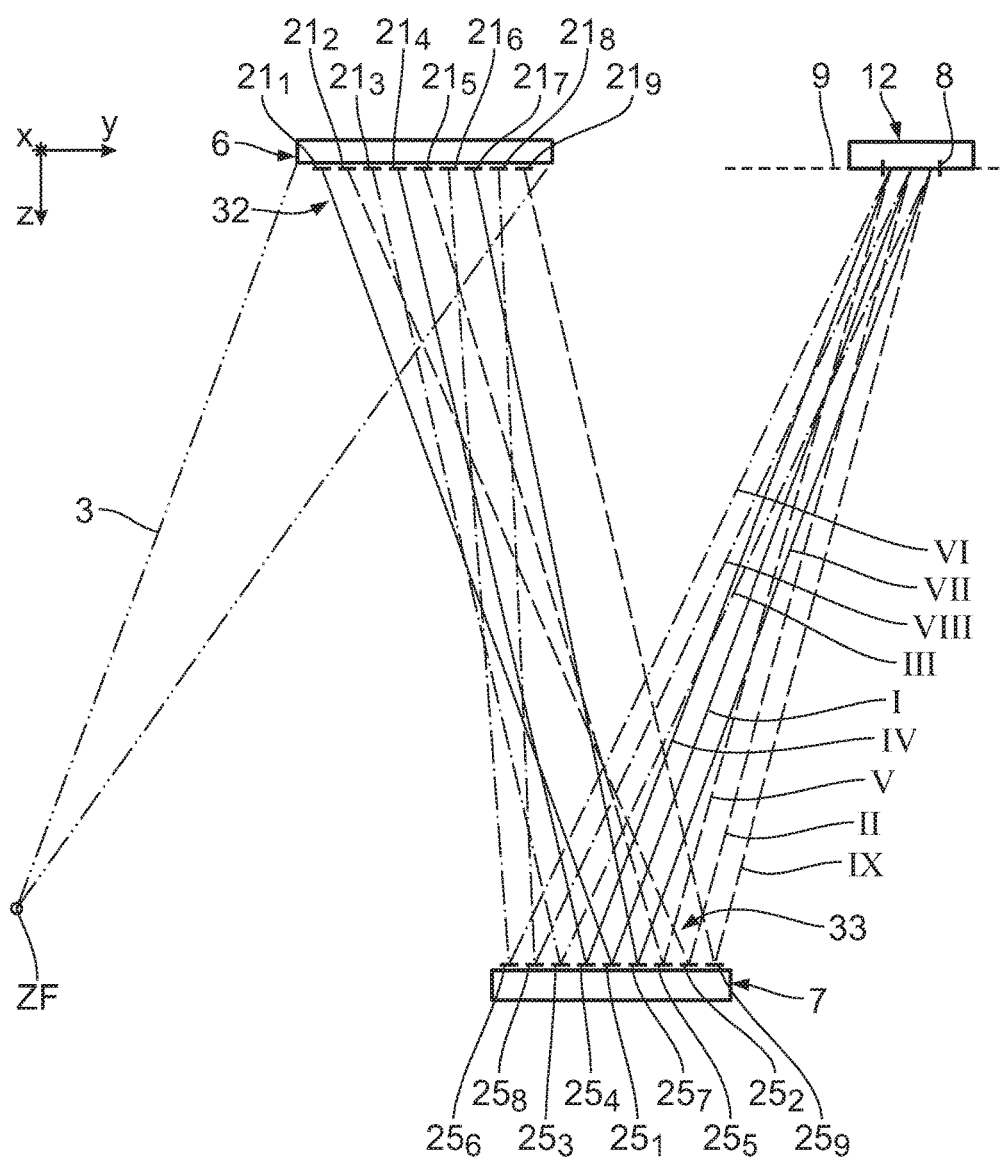
FIG. 2 shows schematically and likewise in meridional section a beam path of selected individual rays of illumination radiation within the illumination optical assembly according to FIG. 1, proceeding from an intermediate focus through to a reticle arranged in an object plane.

From the first facets $21_i$, a line having a total of nine first facets $21_i$ is illustrated schematically in the yz-sectional view according to FIG. 2, the first facets being designated from left to right by $21_1$ to $21_9$ in FIG. 2. In actual fact, the first facet mirror 6 has a significantly greater number of facets $21_i$.

In the case of an embodiment of the illumination optical assembly including a second facet mirror 7 arranged in a pupil plane, an x/y aspect ratio of the first facets 6 is at least equal to the x/y aspect ratio of the object field 8.

The first facets 6 can have an extent of 70 mm in the x-direction and of approximately 4 mm in the y-direction.

The first facets 6 in each case guide a proportion of the illumination radiation 3 via an illumination channel for partial or complete illumination of the object field 8.

The second facet mirror 7 includes a multiplicity of second facets 25. The second facets 25 are displaceable. They have in particular at least two degrees of freedom of displacement, in particular at least two degrees of freedom of tilting.

The second facet mirror 7 includes a multi-mirror array 33 having a plurality of modular multi-mirror elements 34, which are also designated as bricks.

The multi-mirror elements 34 are embodied in particular as MEMS, in particular as an MEMS-MMA. Their structural construction can correspond to that of the multi-mirror elements of the first facet mirror 6, to the description of which reference is made. For details, reference should again be made in particular to DE 10 2011 006 100 A1.

The second facets 25 are in particular virtual facets formed by a multiplicity of individual mirrors 35 of the multi-mirror elements 34.

In this case, a plurality of the second facets 25 can be formed on a single one of the multi-mirror elements 34. The second facets 25 in particular do not extend beyond the edge of one of the multi-mirror elements 34. The multi-mirror elements 34 in each case include in particular a significant number of facets $25_i$. The subdivision of the multi-mirror elements 34 for forming the second facets 25 is described in even greater detail below.

In order to form illumination channels, a respective one of the first facets $21_i$ is assigned to a respective one of the second facets $25_i$. The desired assignment of the first facets $21_i$ to the second facets $25_i$ for defining the illumination channels is predefined in particular before the exposure of the wafer 19.

In the case of the variant of the illumination optical assembly including a second facet mirror 7 (specular reflector) which is not arranged in a pupil plane, the first facets $21_i$ are aligned so as to bring about the illumination of the second facet mirror 7 with a predefined boundary shape and a predefined assignment of the first facets $21_i$ to second facets $25_i$ of the second facet mirror 7. For further details of the embodiment of the second facet mirror 7 and of the projection optical assembly 10, reference is made to WO 2010/099 807 A.

One example of a predefined assignment of the first facets $21_i$ to the second facets $25_i$ is illustrated in FIG. 2. The second facets $25_i$ respectively assigned to the first facets $21_1$ to $21_9$ are indexed according to this assignment. The second facets $25_i$ are illuminated from left to right on the basis of this assignment in the order $25_6$, $25_8$, $25_3$, $25_4$, $25_1$, $25_7$, $25_5$, $25_2$ and $25_9$.

The facets $21_i$, $25_i$ having the indexes 6, 8 and 3 form three illumination channels VI, VIII and III. The indexes 4, 1 and 7 of the facets $21_i$, $25_i$ belong to three further illumination channels IV, I, VII. The indexes 5, 2 and 9 of the facets 21, 25 belong to three further illumination channels V, II, IX.

The illumination of the object field 8 via the first facet mirror 6 and the second facet mirror 7 can be carried out in the manner of a specular reflector. The principle of the specular reflector is known from US 2006/0132747 A1.

Some aspects of the illumination optical assembly 11, in particular of the facet mirrors 6, 7 and of the facets $21_i$, $25_i$, will be described again in different words below.

The illumination optical assembly 11 is in particular a faceted illumination optical assembly 11, in particular a doubly faceted illumination optical assembly 11. It serves for illuminating the object field 8 with illumination radiation 3 from the radiation source 2.

The first facet mirror 6 can be arranged in a field plane, that is to say in a plane of the illumination optical assembly 11 that is conjugate with respect to the object field 8 to be illuminated. It is therefore also designated as field facet mirror. The first facets $21_i$ are correspondingly also designated as field facets. The field facets 21 serve for imaging the intermediate focus ZF onto the respectively assigned second facets $25_i$. The second facets $25_i$ in turn serve for imaging the respective first facets $21_i$ onto the reticle 12.

The second facet mirror 7 can be arranged in a pupil plane of the illumination optical assembly 11. In this case, together with the first facet mirror 6 it forms a fly's eye condenser.

Generally, the two facet mirrors 6, 7 need not necessarily be situated in planes which are conjugate with respect to a field and pupil plane, respectively, of the projection optical assembly 10. The general arrangement of the two facet mirrors 6, 7 is also designated as specular reflector. The term specular reflector hereinafter designates in particular the arrangement in which the first facet mirror 6 is arranged in a field plane, but the second facet mirror 7 is not arranged in a pupil plane, but rather at a distance therefrom.

Preferably, the first facet mirror 6 includes a multiplicity of individual mirrors 31 in the form of a multi-mirror array 32. The individual mirrors 31 are displaceable, in particular.

This enables a flexible assignment of the first facets $21_i$ to the second facets $25_i$ for forming illumination channels, in particular for setting a predefined illumination setting. In this case, an illumination setting shall denote in particular the predefinition of an illumination angle distribution at the reticle 12, that is to say the predefinition of an illumination pupil.

The second facets $25_i$ respectively image the first facets $21_i$ into the reticle 12. The second facets $25_i$ are preferably switchable. The second facet mirror 7 includes in particular a multiplicity of individual mirrors 35. The individual mirrors 35 are displaceable, in particular. They have in particular at least two degrees of freedom of displacement, in particular at least two degrees of freedom of tilting.

The individual mirrors 35 of the second facet mirror 7 are embodied in particular as a multi-mirror element 34, which is also designated as a brick. The multi-mirror element 34 includes a multiplicity of individual mirrors 35, in particular in the form of micro mirrors. The latter can be grouped flexibly to form second facets $25_i$, which, for their part, are therefore also designated as virtual facets.

Preferably, the images of the intermediate focus ZF on the second facet mirror 7 are chosen in such a way that they do not extend, or at any rate extend only slightly, beyond the edge of the assigned virtual second facet $25_i$, in particular beyond the edge of the multi-mirror element 34. In this regard, it is possible to predefine the extent to which the images of the intermediate focus ZF can maximally project beyond the virtual second facets, in particular beyond the edge of the respective multi-mirror element 34. By way of example, it is possible to predefine that the images of the intermedia focus ZF are permitted to project beyond the respective second facets $25_i$, in particular beyond the edge of the respective multi-mirror element 34, maximally to such an extent that at most 30%, in particular at most 20%, in particular at most 10%, in particular at most 5%, in particular at most 1%, of the illumination radiation 3 becomes situated outside the virtual second facet, in particular outside the envelope of the multi-mirror element 34, and therefore does not contribute to the illumination of the object field 8.

The radiation source 2 can have a very high output power. The output power of the radiation source 2 can have in particular at least 100 W, in particular at least 300 W, in particular at least 500 W, in particular at least 1000 W, in particular at least 2000 W, in particular at least 3000 W. This can have the effect that the optical components of the illumination system 20 are subjected to severe thermal loading. This is the case, in particular, if the radiation source 2 has a large spectral bandwidth, as is the case for example for LPP and DPP radiation sources.

A high thermal load can occur in particular in the region of the second facets $25_i$, in particular in the region of the individual mirrors 35 which form the second facets $25_i$, which thermal load is dissipated by the respective facets $25_i$, in particular the individual mirrors 35 thereof.

According to the disclosure, it has been recognised that it is advantageous to ensure that the thermal loading, in particular the mean thermal loading and/or the maximum thermal loading, of the individual mirrors 35 does not exceed a predefined maximum value. In particular the risk of permanent damage can be reduced as a result.

Figure 3:
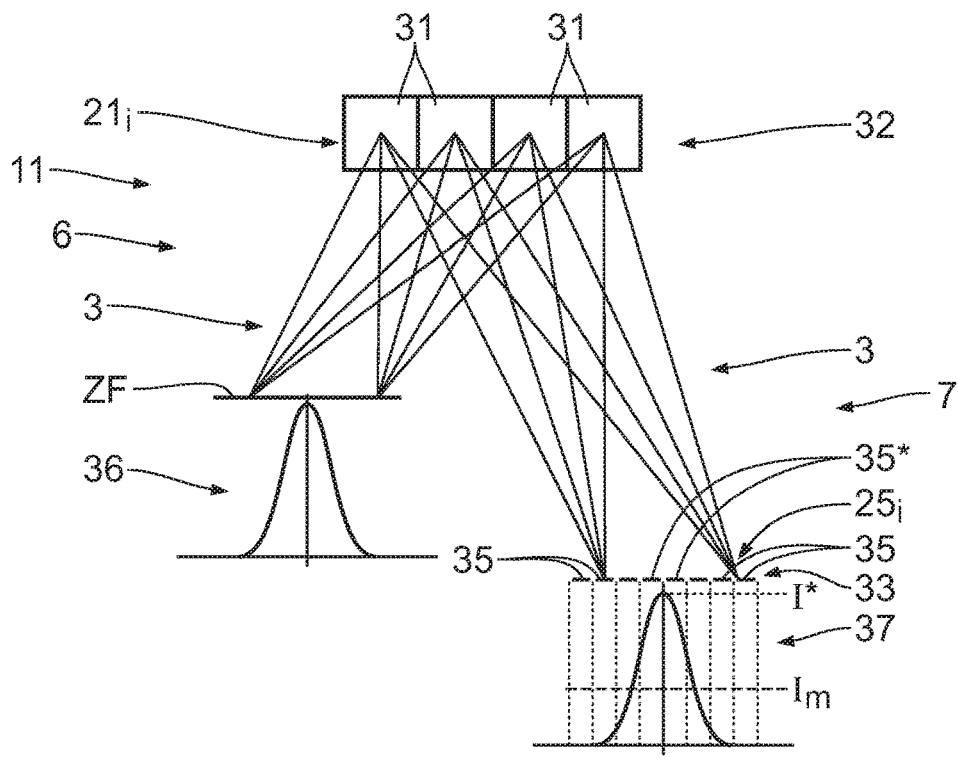
FIG. 3 shows schematically an enlarged excerpt from the beam path of one of the illumination channels in accordance with FIG. 2.

According to the disclosure, it has further been recognized that an inhomogeneous thermal loading of the individual mirrors 35 which form the respective second facet $25_i$ occurs in the case of an inhomogeneous illumination of the second facets 25. This is elucidated by way of example in FIG. 3. As is illustrated by way of example in FIG. 3, a given intensity distribution 36 in the intermediate focus ZF is imaged by the individual mirrors 31 of one of the first facets $21_i$ onto the associated second facet $25_i$, in particular onto the individual mirrors 35 thereof. In this case, each of the individual mirrors 31 of the first facet $21_i$ images the intensity distribution 36 of the intermediate focus ZF onto the second facet $25_i$. If all the images of the intermediate focus ZF in the region of the second facet $25_i$ are perfectly superimposed, then this leads to an intensity distribution 37 having substantially the same shape as the intensity distribution 36. The intensity distribution 37 has a maximum I*. The mean intensity of the illumination radiation 3 in the region of the second facet $25_i$ is indicated schematically and designated by $I_m$.

This has the effect that the individual mirror or individual mirrors 35*, situated precisely in the region of the maximum I* of the intensity distribution 37, are impinged on with a significantly higher intensity and, associated therewith, with a significantly higher thermal load than the other individual mirrors 35, in particular the individual mirrors 35 at the edge of the second facet $25_i$.

According to the disclosure, it has been recognized that the fact that the image of the intermediate focus ZF, that is to say the image of the radiation source 2, on the second facets $25_i$ is composed of many individual images can advantageously be used to reduce the maximum intensity of the illumination radiation 3 in the region of the second facets $25_i$, in particular over the individual mirrors 35 thereof. The principle according to the disclosure is illustrated schematically in FIG. 4. The initial situation illustrated schematically in FIG. 4 corresponds to that illustrated in FIG. 3. As is illustrated by way of example in FIG. 4, provision is made for each of the individual mirrors 31 of the first facet $21_i$ still to become situated on the respectively predefined one of the second facets $25_i$, but for the individual mirrors to be shifted relative to one another. What can be achieved as a result is that the maximum intensity I* of the intensity distribution 37 of the illumination radiation 3 in the region of the second facet $25_i$ is considerably reduced, while the mean intensity $I_m$ remains substantially constant.

In other words, the maximum of the power density of the illumination radiation 3 on the virtual second facets $25_i$ can be greatly reduced, without more than a predefined maximum permissible proportion of the illumination radiation 3 being lost in the process via the edge of the virtual second facet $25_i$, in particular via the edge of the group of the individual mirrors 35 which form the second facet $25_i$, in particular via the edge of the multi-mirror element 34.

Hereinafter, the method according to the disclosure for setting the illumination optical assembly 11, in particular for setting the individual mirrors 31 of the first facets $21_i$, is explained again with reference to FIGS. 5 to 8.

Figure 5:
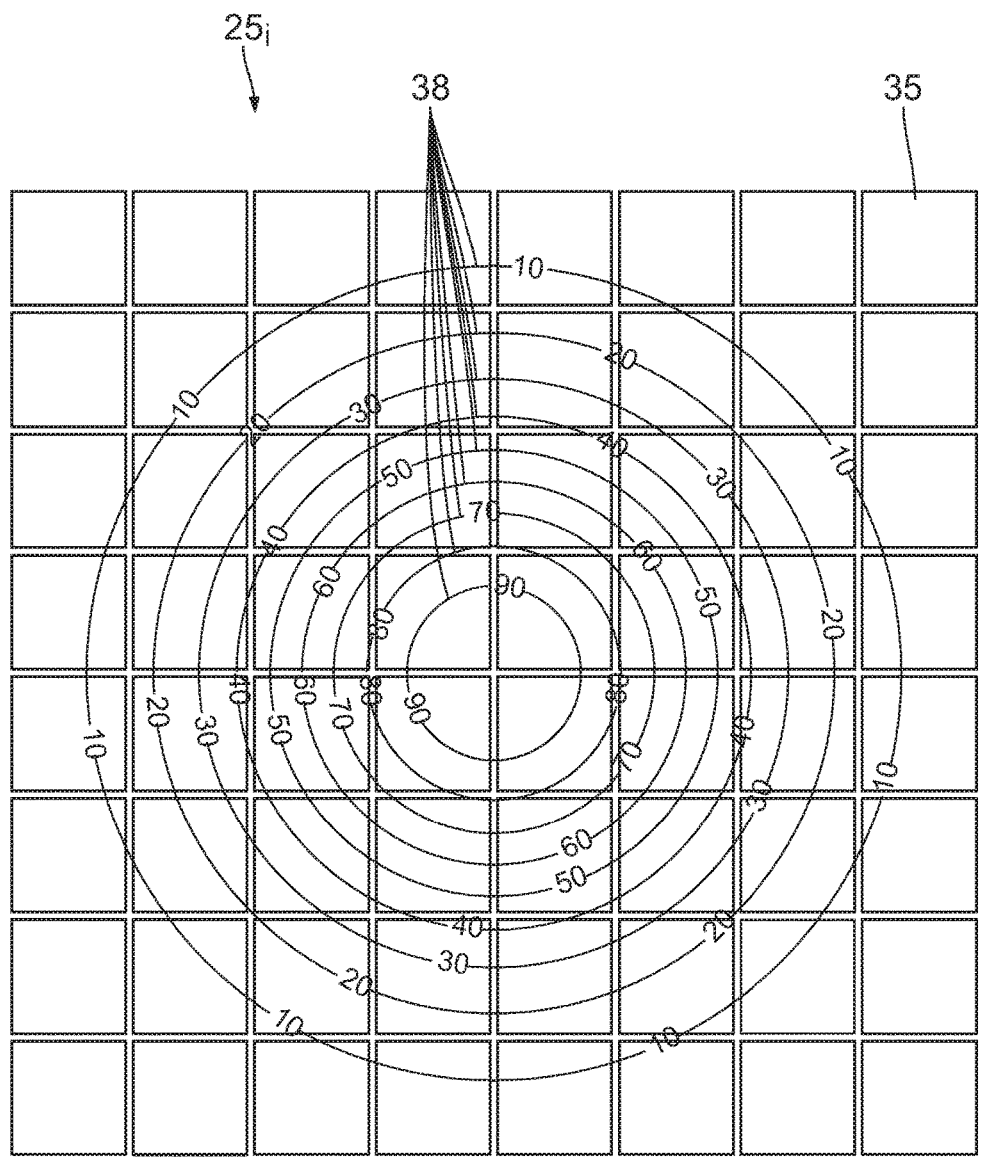
FIG. 5 shows a schematic illustration of the intensity distribution in the region of one of the second facets in the case of the beam path in accordance with FIG. 3.

FIG. 5 schematically shows the plan view of a group of individual mirrors 35 which form one of the second facets $25_i$. The individual mirrors 35 are parts of one of the multi-mirror elements 34. The arrangement of the second facets $25_i$ on the multi-mirror elements 34 is described in even greater detail below. FIG. 5 schematically depicts isointensity lines 38 which characterize the intensity distribution 37. In this case, the ratio with respect to the maximum of the intensity I* in the region of the respective second facet $25_i$ in percent is indicated numerically for each of the isointensity lines 38.

A representation of the intensity distribution in accordance with FIG. 5 discretized according to individual mirrors 35 is reproduced in FIG. 7. In this case, the numerical values reproduce the respective averaged intensity I on the respective individual mirror 35, wherein the values were normalized to the maximum intensity I*=100.

The radiation power reflected overall by the second facets $25_i$ is proportional to the sum of the intensity values indicated in FIG. 7.

Figure 4:
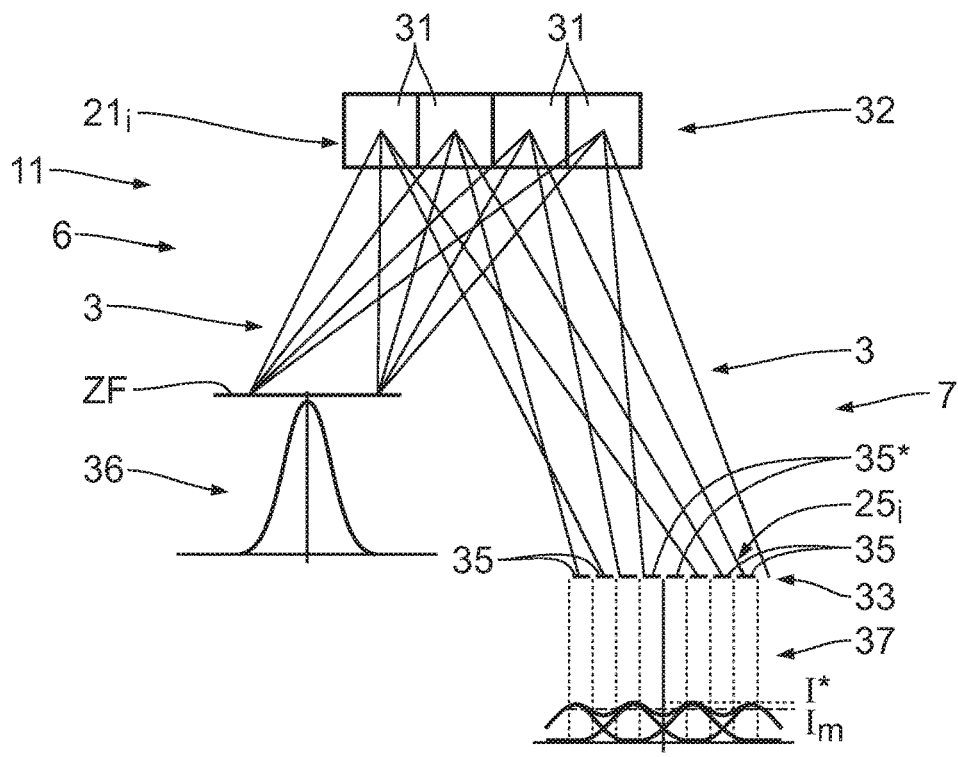
FIG. 4 shows an illustration in accordance with FIG. 3 after a displacement of the individual mirrors of the first facet.
Figure 6:
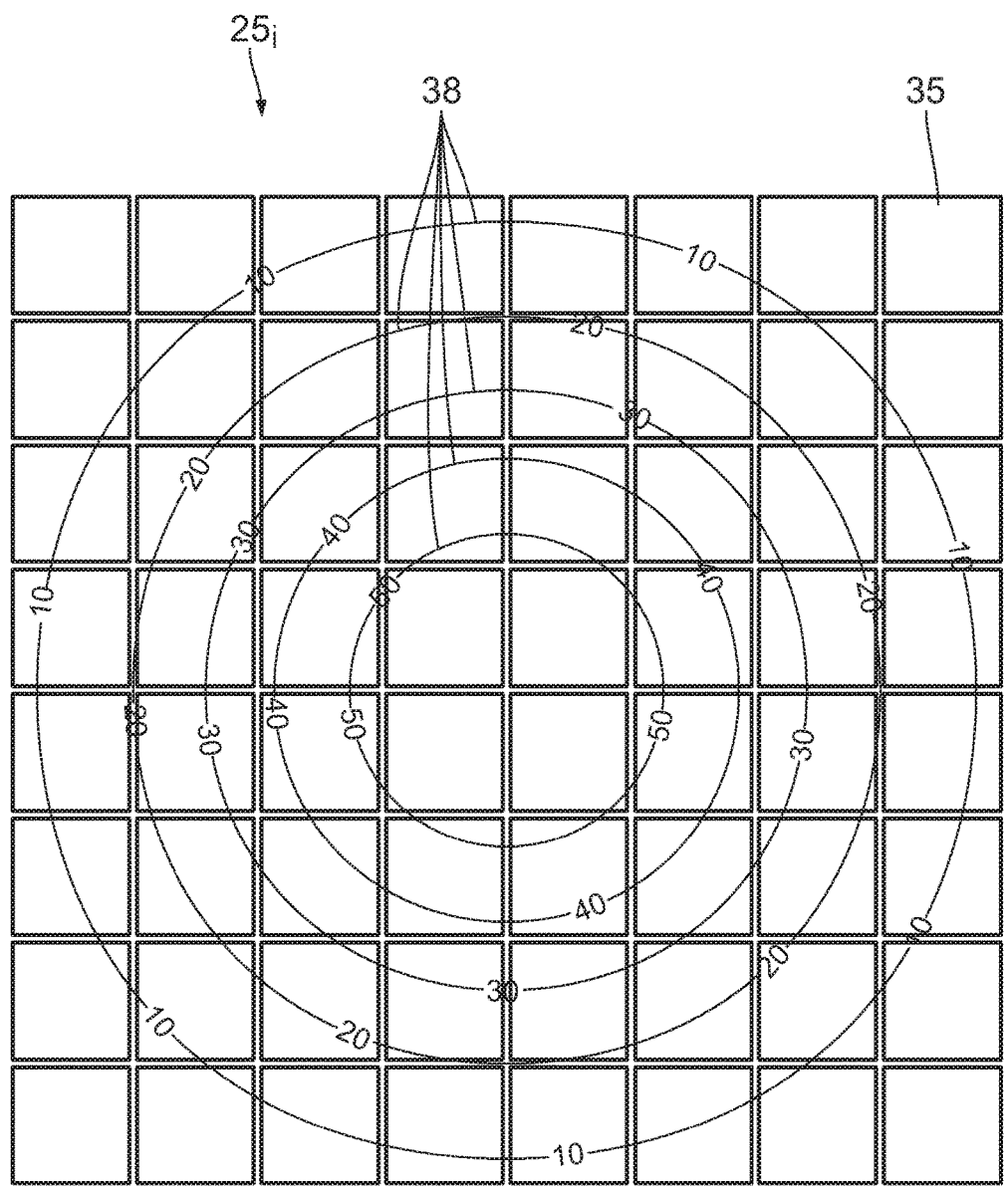
FIG. 6 shows a corresponding illustration for the beam path in accordance with FIG. 4.

FIGS. 6 and 8 reproduce representations corresponding to those in FIGS. 5 and 7 for the situation illustrated schematically in FIG. 4. In this case, the normalization in FIG. 6 corresponds precisely to that in FIG. 5, and the normalization in FIG. 8 corresponds precisely to that in FIG. 7. As is evident by way of example from FIG. 8, the maximum intensity averaged over the individual mirrors 35 was able to be reduced by 37% via a tilting of the individual mirrors 31 of the first facet $21_i$ and a resultant shift in the images of the intermediate focus ZF in the region of the second facet $25_i$ relative to one another. The associated loss of radiation power was able to be limited to less than 10%.

The potential of this method shall be explained below by way of example on the basis of two specific designs of the second facet mirror 7 with reference to FIGS. 9 and 10.

These figures illustrate by way of example the maximum intensity in the region of the individual mirrors 35 of the second facets $25_i$ as a function of the maximum possible geometrical transmission $T_{geom}$ (y-axis) and the full width at half maximum σ of the intensity distribution 37 in the region of the second facets $25_i$.

In this case, the geometrical transmission $T_{geom}$ should be understood to mean the ratio of the energy which impinges on the second facets $25_i$ and the total energy of the assigned intermediate focus images. On account of the distances between the individual mirrors 35, the maximum possible value of $T_{geom}$ is always less than 1. A further reduction of this value arises in the case of a shift of the images of the intermediate focus ZF, since part of the illumination radiation 3 falls off laterally at the edge of the second facet $25_i$ as a result.

Figure 9:
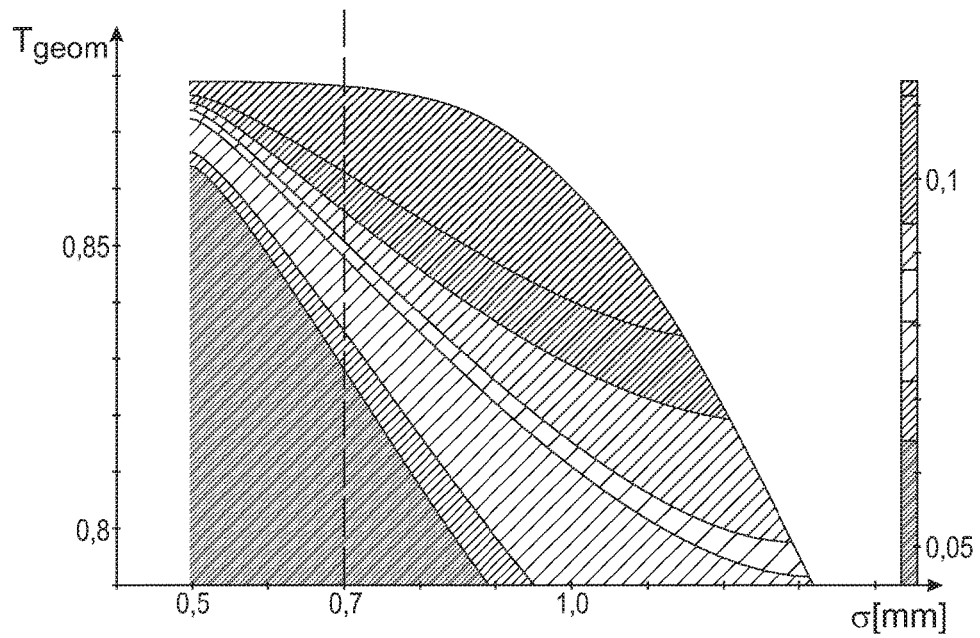
FIG. 9 shows schematically an illustration for the exemplary elucidation of the relationship between the achievable reduction of the absorbed power density as a function of a predefined transmission (y-axis) and plasma image size (x-axis)

FIG. 9 illustrates by way of example the case where the second facet $25_i$ is formed by a grouping of 8×8 individual mirrors 35 on the multi-mirror element 34. The virtual second facet $25_i$ has a size of 5.5×5.5 mm².

Figure 10:
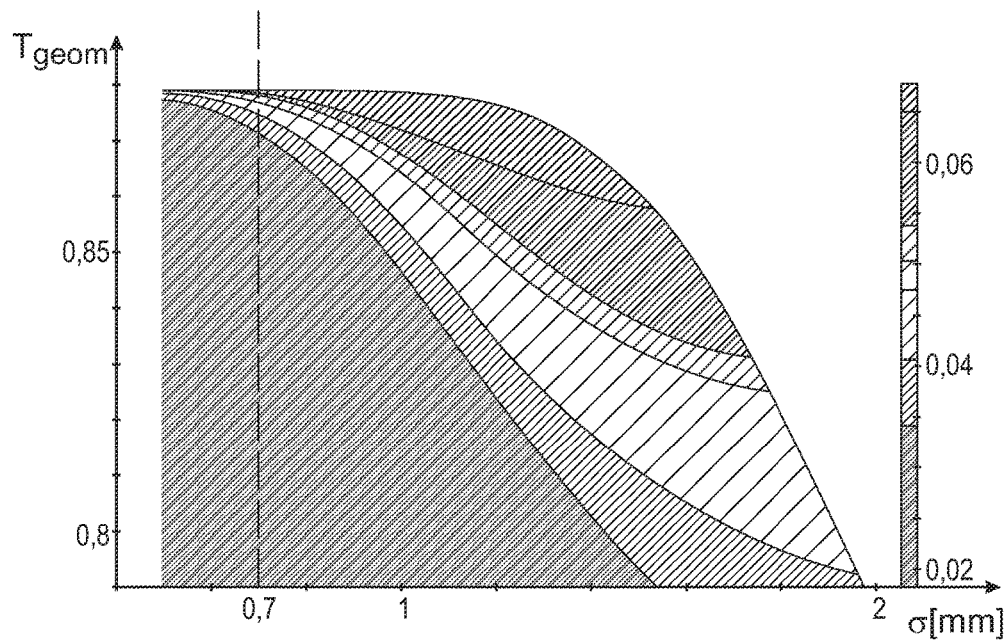
FIG. 10 shows an illustration in accordance with FIG. 9 in the case of larger virtual second facets.

In the case illustrated in FIG. 10, the virtual second facet $25_i$ was formed by a grouping of 12×12 individual mirrors 35 on the multi-mirror element 34. It had an area of 7×7 mm².

With regard to the scaling of the figures, it should be noted that at the upper edge of the figures the case where all the images of the intermediate focus ZF are superimposed exactly was removed manually in order to make the illustration clearer. This case does not occur in practice anyway on account of ever present instances of blurring.

The respective upper edge of the figures represents the case where all the images of the intermediate focus ZF on the respective second facet $25_i$ are arranged in a centred manner. The top right corners are white because for a given source size there is no realization with transmission of corresponding magnitude since too much energy already is incident between the micro mirrors or lies beyond the virtual facets 25.

A shift of the images of the intermediate focus ZF on the second facets $25_i$ on account of a swamping of the virtual facets $25_i$ always leads to a loss of radiation, that is to say to a reduction of the geometrical transmission $T_{geom}$. This effect can be reproduced in FIGS. 9 and 10 as movement parallel to the y-axis in the direction of descending values.

As is qualitatively evident from FIGS. 9 and 10, the potential of the method according to the disclosure is dependent on the size of the images of the intermediate focus ZF in the region of the second facets $25_i$, in particular on the full width at half maximum σ of the intensity distribution 37.

The smaller the image of the radiation source 2 in the intermediate focus ZF, the better the maximum intensity in the region of the second facets $25_i$ can be reduced, without this leading to a great reduction of the geometrical transmission $T_{geom}$, in particular to a great loss of the reflected illumination radiation 3. By contrast, larger radiation sources show less potential if the loss of radiation is intended to be kept small.

If consideration shall be given for example to a radiation source whose image in the intermediate focus ZF has a full width at half maximum σ=0.7 mm, in the case of the variant illustrated in FIG. 9 a reduction of the power density by 50% is associated with a loss of radiation of approximately 10%, while the loss of radiation in the case of the variant in accordance with FIG. 10 is only approximately 1% in this case given a reduction of the maximum intensity by 50%.

It should be pointed out that the shift of the images of the intermediate focus ZF on the second facets $25_i$ leads to a movement of the pupil illumination, that is to say to a movement of the pupil coordinates of the plasma images as a function of the field coordinate. However, since the pupil spots carry out a movement with the field coordinate anyway in a manner governed by the concept, this is unproblematic in the present context.

Furthermore, it should be noted that a shift of the images of the intermediate focus ZF on the virtual second facets $25_i$ is not necessarily provided for all the illumination channels. Such a shift is provided in particular only for the illumination channels which lead to a maximum intensity on at least one of the individual mirrors 35 which is above a predefined permissible maximum value $I_{max}$, that is to say leads to an impermissibly high thermal loading of the individual mirrors 35. It has been recognized, in particular, that a shift does not have to take place in the same way for all the illumination settings. It has further been recognized that it is therefore advantageous to make the size of the virtual second facets $25_i$ as flexible as possible. This is described in greater detail below.

The above-described potential for reducing the thermal load of the individual mirrors 35 which form the virtual second facets $25_i$, as was explained by way of example with reference to FIGS. 9 and 10, is dependent on the size of the virtual second facets $25_i$, that is to say dependent on the division of the multi-mirror elements 34 into groups of the individual mirrors 35 which form the virtual second facets $25_i$. In this case, it should be taken into account that the virtual second facets $25_i$ are intended not to project beyond the edge of one of the multi-mirror elements 34. Moreover, the multi-mirror elements 34 are intended to be covered with virtual second facets $25_i$ in as uninterrupted a manner as possible. To put it another way, on account of transmission and risk of stray light, only whole plasma images are permitted to lie within one of the multi-mirror elements 34, and in as close packed a manner as possible. In order to increase the flexibility of the division of the multi-mirror elements 34 into virtual second facets $25_i$, it is therefore desirable to dimension the multi-mirror elements 34 in such a way that there are as many different possibilities for this division as possible. If it is assumed here that all of the virtual second facets $25_i$ have identical dimensions, the number of different possibilities of how the multi-mirror element 34 can be divided into virtual facets $25_i$ is uniquely predefined in each case. If the number of individual mirrors 35 per multi-mirror element 34 is precisely $2^n \times 2^n$, for example, then the possibilities of the representable virtual second facets $25_i$ can be designated as irreducible in accordance with the representation theory of finite-dimensional groups. Advantageously, the number of lines and/or columns of the individual mirrors 35 of the multi-mirror element 34 is chosen in such a way that this is not the case, that is to say that the possibilities of the grouping of the individual mirrors 35 to form virtual facets $25_i$ has a reducible representation.

It is advantageous, in particular, to choose the number of lines and/or columns of the individual mirrors 35 of the multi-mirror element 34 in such a way that they have at least two different prime factors, in particular two and three. Numbers of lines and columns are advantageous for which there are as many devisors as possible, in particular as many devisors as possible whose ratio is close to one.

The number of lines and/or columns is chosen, in particular, in such a way that they have a particularly high number of devisors. This increases the flexibility in the uninterrupted division of the multi-mirror array, particularly in the division into identical partial fields. In the case of a mirror array having up to 100 lines and/or columns, the number of lines and/or columns is in particular 12, 18, 20, 24, 28, 30, 32, 36, 40, 42, 44, 45, 48 or 60. The values 12, 24, 36, 48 or 60 are particularly preferred. These are in each case the smallest integers which have at least 6, 8, 9, 10 and 12 devisors, respectively.

A finer coordination of the size of the virtual second facets $25_i$ can be achieved by permitting non-square shapes thereof.

In the case of rectangular, non-square second facets $25_i$, it is advantageous to arrange them in such a way that their larger extent runs perpendicularly to the scan direction. This is because it has been recognized that the problem of high thermal loads occurs particularly if the desired pupil shape consists of partial regions having a large extent in the x-direction, for example in the case of an illumination setting in the form of a y-dipole. In this case, the illumination spots can propagate in the x-direction without major disadvantages. Moreover, in the case of a specular reflector, the illumination channels have a larger pupil extent in the scanning direction anyway on account of the scan process. They are therefore also designated as rod pupils.

Figure 11:
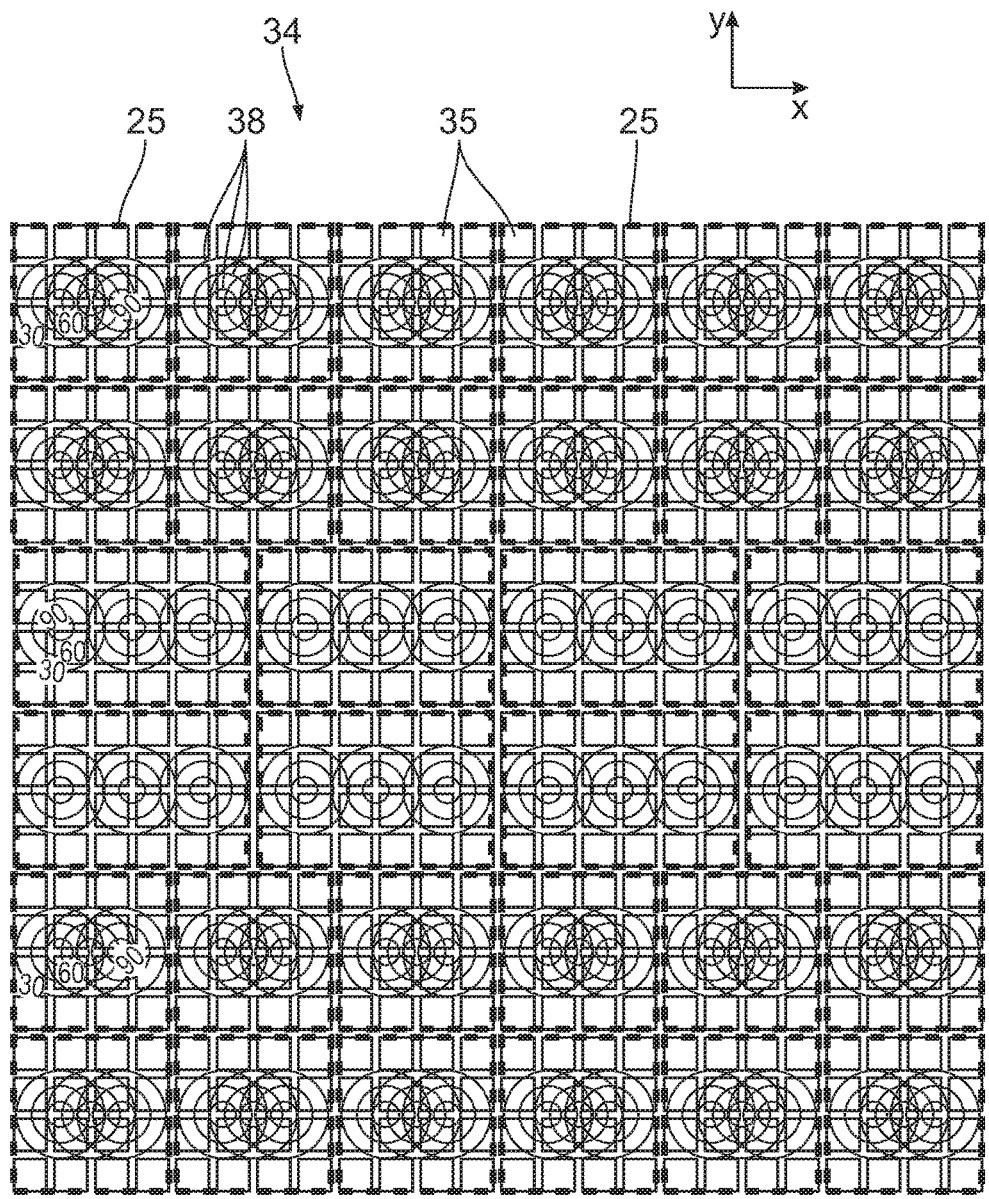
FIG. 11 shows schematically a subdivision of a modular multi-mirror element having 24×24 micro mirrors into virtual second facets, wherein the individual facets have different shapes.

One example of a subdivision of one of the multi-mirror elements 34 into virtual facets $25_i$ is described below with reference to FIGS. 11 and 12. The multi-mirror element 34 in accordance with FIG. 11 is a brick having 24×24 individual mirrors 35 in the form of micro mirrors. The individual mirrors 35 can in each case have dimensions of 0.6×0.6 mm$^2$. The distance between adjacent individual mirrors 35 is 0.04 mm.

The multi-mirror element 34 includes four lines each having six square virtual second facets $25_i$, which are formed in each case from 4×4 individual mirrors 35.

Two lines having rectangular, non-square virtual facets $25_i$ having the size of 4×6 individual mirrors 35 are arranged in the centre between in each case two lines having the square facets $25_i$.

Such a division is advantageous particularly if precisely the central virtual facets $25_i$, on account of their position on the second facet mirror 7 of a specular reflector, have to illuminate particularly large partial fields in the object field 8 and are therefore subjected to severe thermal loading. A larger shift and thus a greater smearing of the intensity distribution 37 on the facets $25_i$ is possible on account of the larger extent in the x-direction.

Generally, the facets $25_i$ can be larger in a central region of the second facet mirror 7, in particular in a central region of the pupil, than in an edge region. Generally, the facets $25_i$ of the second facet mirror 7 can have different sizes. In particular, they are larger in a first region of the second facet mirror 7 than in a second region. The size difference is in particular at least 10%, in particular at least 30%, in particular at least 50%, in particular at least 100%, of the size of the smallest facet $25_i$ of the second facet mirror 7.

Figure 12:
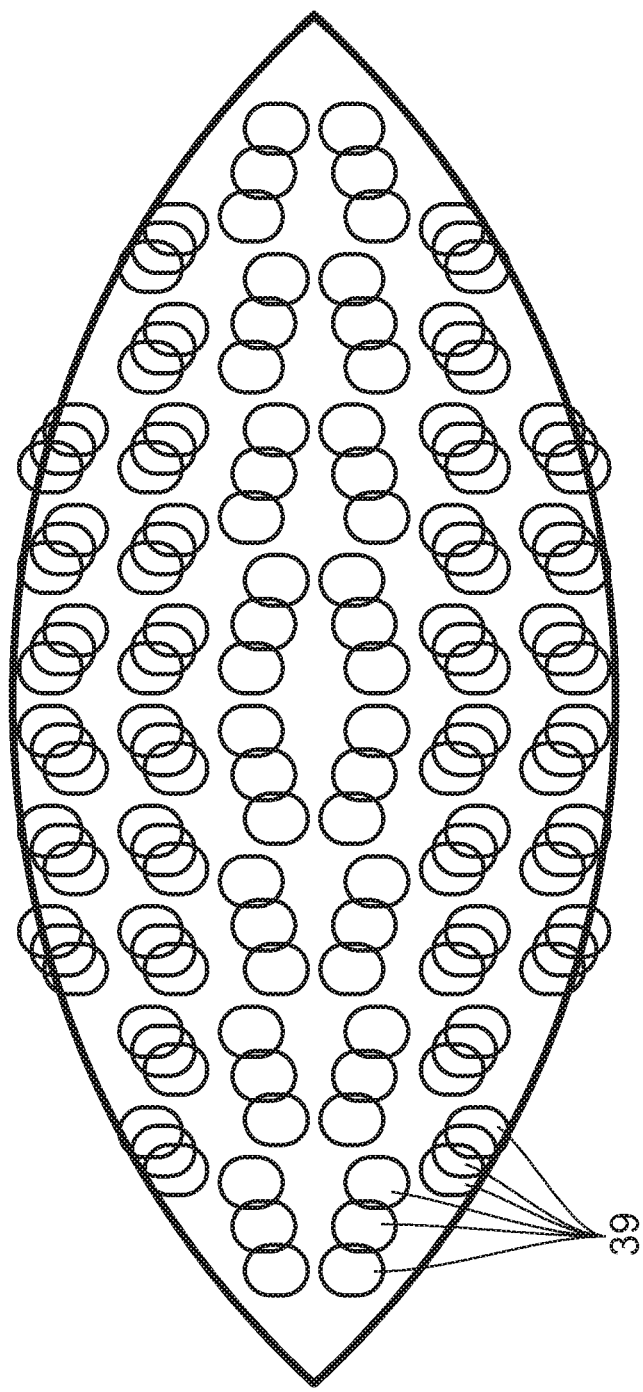
FIG. 12 shows a schematic illustration of one of the poles of a y-dipole illumination setting for a classification of the virtual second facets in accordance with FIG. 11.

FIG. 12 illustrates by way of example the image of the pupil in the object field 8. The individual pupil spots 39 are embodied in an elongate, rod-shaped fashion. The pupil spots 39 are not situated on a regular grid.

The disclosure provides for all of the virtual facets $25_i$ having a substantially identical y-coordinate to be classified substantially identically. A field dependence of the pupil can be avoided as a result.

By way of example, FIGS. 11 and 12 illustrate an illumination of each of the virtual second facets $25_i$ by in each case three images of the intermediate focus ZF. The actual number of images of the intermediate focus ZF on each of the virtual second facets $25_i$ can be significantly higher.

In order to reduce the thermal load, the images of the intermediate focus ZF are shifted relative to one another in the x-direction, that is to say offset relative to one another. In the case of the smaller square second facets $25_i$, the offset is to a lesser extent than in the case of the central, larger, rectangular, non-square facets $25_i$.

Isointensity lines 38 are once again depicted for clarifying the images of the intermediate focus ZF. The numerical values reproduced in FIG. 11 indicate in each case the intensity in percent of the maximum intensity.

An additional shift in the y-direction, which is likewise possible, is not illustrated for reasons of clarity.

FIG. 12 illustrates one of the poles of a y-dipole for a classification of the multi-mirror element 34 into virtual facets $25_i$ in accordance with FIG. 11.

The rectangular facets $25_i$ in the centre of the multi-mirror element 34 have the effect that the rod-shaped pupil spots 39 are situated further apart in a central region of the pole, in particular where its x-extent is the largest. Thus, the intensity is reduced there as well.

Since the individual mirrors 31 of the first facet $21_i$ that belong to the images of the intermediate focus ZF in FIG. 11 lie at different y-positions in the scan direction, the pupil spots 39 that belong to the respective individual mirrors 31 are shifted relative to one another in the y-direction. Instead of a single, long, vertical, rod-shaped pupil spot formed by three overlapping pupil spots 39, pupil spots 39 offset in the x-direction arise which jointly act like a rotated rod, that is to say have a rod-shaped, rotated envelope.

In this case, the direction of rotation was adapted such that it is oriented to the shape of the pole. As a result, it was possible to improve the filling of the pole. The central rods are rotated in particular to a greater extent since the associated images of the intermediate focus ZF on the virtual second facets $25_i$ are shifted to a greater extent in the x-direction.

The shift in the y-direction and the shape of the individual pupil spots 39 are identical at all points. In particular the images of the intermediate focus ZF on the virtual second facets $25_i$ are identical in each case. The size of the first facets $21_i$ and of the individual mirrors 31 thereof is also identical in each case. A homocentric pupil is involved.

Figure 13:
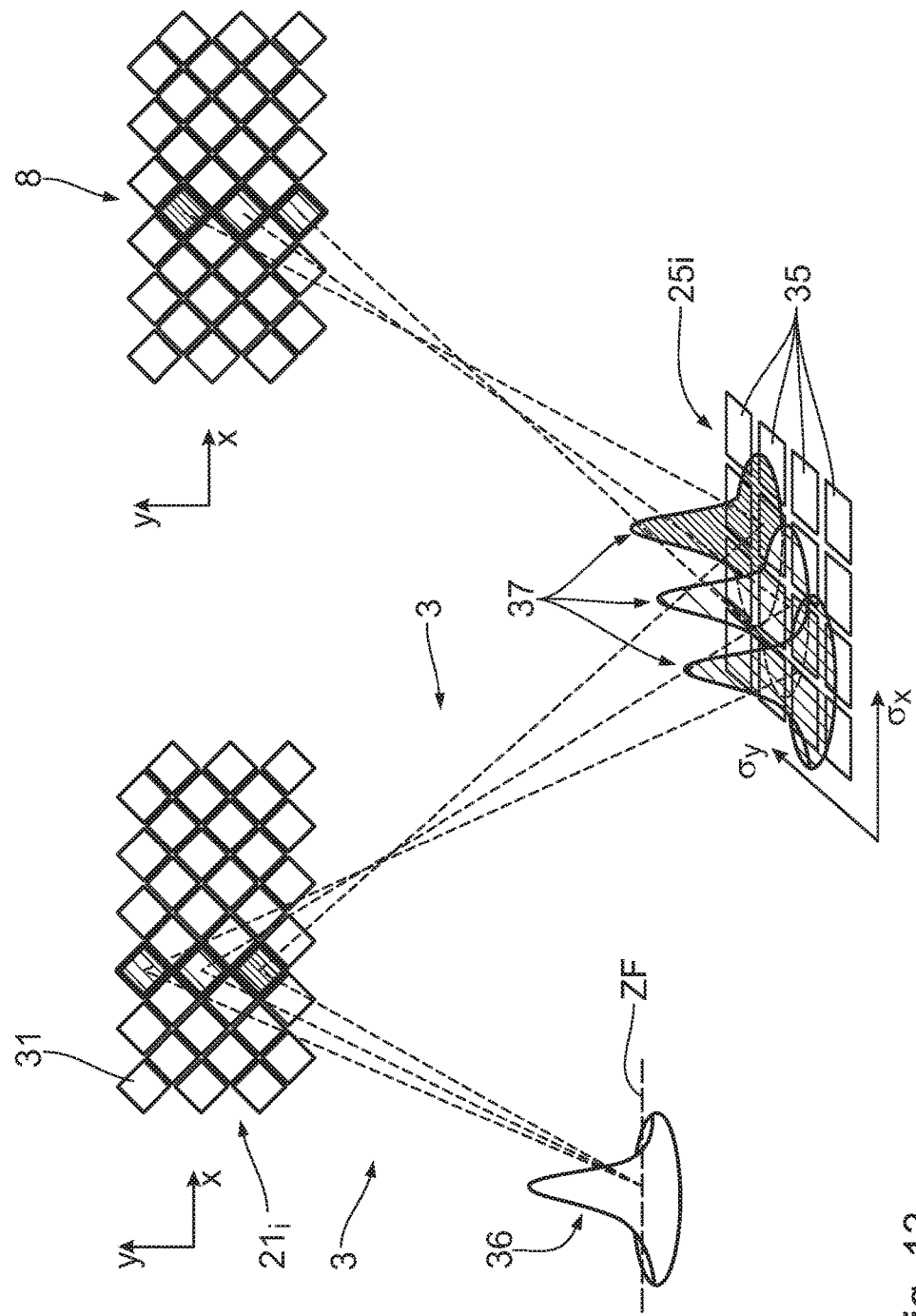
FIG. 13 shows a schematic illustration corresponding to FIG. 4 for explaining an advantageous tilting of the individual mirrors of the first facet.

Further aspects of the disclosure are described below with reference to FIG. 13. Provision can be made, in particular, for arranging diametrically the images generated by the individual mirrors 31 of the first facet $21_i$ on the second facet $25_i$.

As a result, it is possible to stabilize the stability of the illumination system 20 in relation to a disturbance of the radiation source 2, in particular in the form of drift or wobble. By way of example, if the radiation source 2 moves in such a way that the outermost one of the images of the intermediate focus ZF on one side of the virtual second facet $25_i$ slips further over the edge thereof and illumination radiation 3 for illuminating the object field 8 is lost as a result, then at the same time the image of the intermediate focus ZF on the opposite side of the second facet $25_i$ is captured to a greater extent. If the curvature of the local image of the intermediate focus ZF is small, what can be achieved as a result is that the scan integral in the object field 8 remains at least almost invariant.

Preferably, the power of the illumination radiation 3 that is reflected by two individual mirrors 31 of one of the first facets $21_i$ which are imaged adjacently into the reticle 12 is substantially identical. They are assigned to one of the second facets $25_i$, in particular pivoted, in particular in such a way that the respective changes in the intensity in the region of the second facet $25_i$ upon a movement of the radiation source 2 substantially mutually cancel one another out. A particularly smooth course of the intensity profile, in particular a particularly homogeneous illumination of the reticle 12, can be achieved as a result.

In other words, via a targeted arrangement of the images of the intermediate focus ZF on the second facets $25_i$, the effect of an undesirable, highly disturbing local dose error can be reduced, in particular avoided.

A further possibility would be to choose the shift of the individual images of the intermediate focus ZF on the vertical second facets $25_i$ in such a way that the length of the rod-shaped pupil spots 39 is reduced. Moreover, the resulting rod-shaped pupil spots can be rotated in such a way that they have an orientation tangential to the pupil boundary at least at the edge of the pupil.

In accordance with a further aspect of the disclosure, provision is made for adapting the absolute value of the shift of the images of the intermediate focus ZF on the second facets $25_i$, that is to say the degree of smearing of the respective intensity distributions 37, in each case to the thermal load of the respective illumination channel. For virtual second facets $25_i$ having a low thermal load, the individual images are shifted only slightly relative to one another. It may even be possible to completely dispense with a shift. On the other hand, the images for the second facets $25_i$ which are illuminated by very many and/or very high-intensity first individual mirrors 31 are shifted relative to one another to a correspondingly greater extent.

The resultant systematic, long-wave variations in the object field 8 or in the pupil, in particular an increase in the energy at the edge of the object field 8 or the pupil, can be compensated for, for example, by switching on or off, that is to say pivoting, the individual mirrors 31 of the first facets $21_i$ and/or via an adapted channel assignment.

With regard to stability and homogeneity of the imaging properties, it may be advantageous, instead of a static positioning of the intermediate focus images on the second facets, to embody the latter in a dynamic fashion. In this case, within the time duration of the exposure of a point in the field of view 17, that is to say of a point on the wafer 19, given by the quotient of scan length (extent of the illumination field in the scan direction) and scan rate, all intermediate focus image positions should be swept over at least once. For details of the dynamic positioning of the intermediate focus images on the second facets, reference should be made to WO 2010/037 437 A1.

What is claimed is:

1. An illumination optical assembly, comprising:
    a first facet element comprising a multiplicity of first facets that are displaceable into different displacement positions; and
    a second facet element comprising a multiplicity of second facets,
    wherein:
        illumination channels configured to illuminate an object field with illumination radiation are defined by an assignment of a respective first facet and a respective second facet;
        each first facet comprises a multiplicity of displaceable individual mirrors;
        for each displaceable individual mirror of each first facet, the displaceable individual mirror is displaceable to generate an image of an intermediate focus on the respectively assigned second facet;
        displacement positions of the individual mirrors of the first facets are configured so that, when there is a predefined intensity distribution of the illumination radiation in the intermediate focus, the illumination radiation in a region of the facets of the second facet element has an intensity distribution with a maximum that is: a) at most equal to a predefined maximum intensity; or b) greater than a mean value of the intensity distribution by at most a predefined factor or absolute value;

at least one of the following holds for each of at least some of the second facets: i) a size of the second facet is variable; and ii) a shape of the second facet is variable; and the illumination optical assembly is a projection lithography illumination optical assembly.

2. The illumination optical assembly of claim 1, wherein:
the second facet element comprises a multi mirror array comprising a plurality of modular multi mirror elements; and each multi mirror element has dimensions that are at least equal to dimensions of the images of the intermediate focus in the region of the second facet element.

3. The illumination optical assembly of claim 2, wherein the displacement positions of a plurality of the individual mirrors of a given first facet are configured to generate images of the intermediate focus on the respectively assigned second facet whose maxima are offset relative to each other by a minimum absolute value.

4. The illumination optical assembly of claim 1, wherein the individual mirrors of at least one of the first facets are displaced so that, for a given intensity distribution in the intermediate focus, the intensity distribution of the image of the intermediate focus on the corresponding second facet has a full width at half maximum which is at least 10% greater than a full width at half maximum, scaled by an imaging scale of the illumination optical assembly, of the intensity distribution in the intermediate focus.

5. The illumination optical assembly of claim 1, wherein the individual mirrors of the first facets are displaced so that illumination channels in a region of a pupil are at a distance in a direction perpendicular to a scan direction which is dependent on their position in the scan direction.

6. The illumination optical assembly of claim 1, wherein:
the second facet element comprises a multi mirror array comprising a plurality of modular multi mirror elements;

each multi mirror element has dimensions that are at least equal to dimensions of the images of the intermediate focus in the region of the second facet element;

the displacement positions of a plurality of the individual mirrors of a given first facet are configured to generate images of the intermediate focus on the respectively assigned second facet whose maxima are offset relative to each other by a minimum absolute value;

the individual mirrors of at least one of the first facets are displaced so that, for a given intensity distribution in the intermediate focus, the intensity distribution of the image of the intermediate focus on the corresponding second facet has a full width at half maximum which is at least 10% greater than a full width at half maximum, scaled by an imaging scale of the illumination optical assembly, of the intensity distribution in the intermediate focus; and the individual mirrors of the first facets are displaced so that illumination channels in a region of a pupil are at a distance in a direction perpendicular to a scan direction which is dependent on their position in the scan direction.

7. An illumination system, comprising:
a radiation source; and
an illumination optical assembly according to claim 1.

8. An optical system, comprising:
an illumination optical assembly according to claim 1; and
a projection optical assembly.

9. An apparatus, comprising:
a radiation source; and
an optical system, comprising:
an illumination optical assembly according to claim 1; and
a projection optical assembly,
wherein the apparatus is a projection exposure apparatus.

10. A method of using a projection exposure apparatus comprising an illumination optical assembly and a projection optical assembly, the method comprising:
using the illumination optical assembly to illuminate at least one section of a reticle with radiation; and
using the projection optical assembly to project an image of the at least one section of the reticle onto a material that is sensitive to the radiation,
wherein the illumination optical assembly is an illumination optical assembly according to claim 1.

11. A method, comprising:
providing an illumination optical assembly comprising:
a first facet element comprising a multiplicity of first facets that are displaceable into different displacement positions; and
a second facet element comprising a multiplicity of second facets,
wherein:
illumination channels configured to illuminate an object field with illumination radiation are defined by an assignment of a respective first facet and a respective second facet;
each first facet comprises a multiplicity of displaceable individual mirrors;
for each displaceable individual mirror of each first facet, the displaceable individual mirror is displaceable to generate an image of an intermediate focus on the respectively assigned second facet;
displacement positions of the individual mirrors of the first facets are configured so that, when there is a predefined intensity distribution of the illumination radiation in the intermediate focus, the illumination radiation in a region of the facets of the second facet element has an intensity distribution with a maximum that is: a) at most equal to a predefined maximum intensity; or b) greater than a mean value of the intensity distribution by at most a predefined factor or absolute value; and
the illumination optical assembly is a projection lithography illumination optical assembly;
predefining the intensity distribution in the intermediate focus;
predefining an assignment of at least one subset of the first facets to at least one subset of the second facets for forming illumination channels;
predefining a maximum intensity permitted to impinge on the second facets;
determining a distribution of the intensity which impinges on the second facets in the case of the given assignment; and
displacing a subset of the individual mirrors of the first facets so that the intensity on the second facets is at most equal to the maximum intensity,
wherein the size of the second facets is chosen depending on at least one parameter selected from the group consisting of a power to be reflected, a thermal load and a predefined minimum transmittance.

12. The method of claim 11, wherein a minimum transmittance is pre-defined which is attained by the second facets after the displacement of the individual mirrors.

13. A method of using an illumination optical assembly that comprises a first facet element comprising a multiplicity of displaceable first facets, the illumination optical assembly also comprising a second facet element comprising a multiplicity of second facets, illumination channels being configured to illuminate an object field with illumination radiation are defined by an assignment of a respective first facet and a respective second facet, each displaceable individual mirror of each first facet being displaceable to generate an image of an intermediate focus on the respectively assigned second facet, the method comprising:
- predefining the intensity distribution in the intermediate focus;
- predefining an assignment of at least one subset of the first facets to at least one subset of the second facets for forming illumination channels;
- predefining a maximum intensity permitted to impinge on the second facets;
- determining a distribution of the intensity which impinges on the second facets in the case of the given assignment; and
- displacing a subset of the individual mirrors of the first facets so that the intensity on the second facets is at most equal to the maximum intensity, wherein the size of the second facets is chosen depending on at least one parameter selected from the group consisting of a power to be reflected, a thermal load and a predefined minimum transmittance.

14. The method of claim 13, wherein a minimum transmittance is pre-defined which is attained by the second facets after the displacement of the individual mirrors.

15. The illumination optical assembly of claim 1, wherein, for each of at least some of the second facets, the size of the second facet is variable.

16. The illumination optical assembly of claim 15, wherein, for each of at least some of the second facets, the shape of the second facet is variable.

17. The illumination optical assembly of claim 1, wherein, for each of at least some of the second facets, the second facet comprises a micromirror array.

18. The illumination optical assembly of claim 1, wherein a size difference between two of the second facets is at least 10%.

* * * * *